United States Patent [19]
Rosen

[11] Patent Number: 5,235,543
[45] Date of Patent: Aug. 10, 1993

[54] DUAL PORT STATIC MEMORY WITH ONE CYCLE READ-MODIFY-WRITE

[75] Inventor: Eitan E. Rosen, Abirim, Israel

[73] Assignee: Intel Corporation, Santa Clara, Calif.

[21] Appl. No.: 932,905

[22] Filed: Aug. 19, 1992

Related U.S. Application Data

[63] Continuation of Ser. No. 752,197, Aug. 20, 1991, abandoned, which is a continuation of Ser. No. 458,985, Dec. 29, 1989, abandoned.

[51] Int. Cl.$^5$ .................. G11C 7/00; G11C 11/00; G11C 11/34; G11C 8/00
[52] U.S. Cl. .................................... 365/154; 365/174; 365/190; 365/203; 365/230.05
[58] Field of Search ............ 365/154, 174, 190, 230.05, 365/203

[56] References Cited

U.S. PATENT DOCUMENTS

| | | | |
|---|---|---|---|
| 3,638,204 | 1/1972 | Kolankowsky | 365/230.05 |
| 4,395,765 | 7/1983 | Moffitt et al. | 365/230.05 |
| 4,447,891 | 5/1984 | Kadota | 365/230.05 |
| 4,599,708 | 7/1986 | Schuster | 365/174 |
| 4,616,347 | 10/1986 | Bernstein | 365/230.05 |
| 4,660,177 | 4/1987 | O'Connor | 365/203 |
| 4,768,172 | 8/1988 | Sasaki | 365/230.05 |
| 4,815,038 | 3/1989 | Scharrer et al. | 365/230.05 |
| 4,817,051 | 3/1989 | Chang | 365/230.05 |
| 4,823,314 | 4/1989 | Sharp | 365/190 |
| 4,823,321 | 4/1989 | Aoyama | 365/189.05 |
| 4,825,098 | 3/1989 | Aoyama | 365/230.05 |
| 4,833,648 | 5/1989 | Scharrer et al. | 365/230.05 |
| 4,858,181 | 8/1989 | Scharrer et al. | 365/154 |
| 4,860,263 | 8/1989 | Mattausch | 365/230.05 |
| 4,933,899 | 6/1990 | Gibbs | 365/154 |
| 5,016,214 | 5/1991 | Laymoun | 365/154 |

FOREIGN PATENT DOCUMENTS

| | | |
|---|---|---|
| 2288860 | 4/1988 | European Pat. Off. |
| 68794 | 4/1986 | Japan .......................... 365/230.05 |

Primary Examiner—Joseph L. Dixon
Assistant Examiner—Michael A. Whitefield
Attorney, Agent, or Firm—Blakley, Sokoloff, Taylor & Zafman

[57] ABSTRACT

A dual port static memory cell with one cycle read-modify-write operation. The static memory cell includes a write line for receiving new data to be written into the static memory cell, switching means for coupling the new data into the static memory cell, and an extended word line generator for generating an extended word line signal. The extended word line signal controls the switching means. During the active state of the extended word line signal, the switching means is enabled to couple new data into the static memory cell while precharge is placed on a bit line coupled to the static memory cell, without disturbing the precharge. The extended word line signal goes active in response to an active state of the word line signal and remains active even after the word line signal goes inactive. The extended word line signal returns to an inactive state prior to the beginning of a new memory cycle. The inactive state of the extended word line signal decouples the new data from the switching means. During a read-modify-write operation precharge on the bit lines after the read operation is undisturbed when writing occurs into the cell from the write lines. In the dual port memory a conflict determining circuit is used to provide a predetermined state to the cell when simultaneous access is sought for writing to the cells with conflicting data.

7 Claims, 4 Drawing Sheets

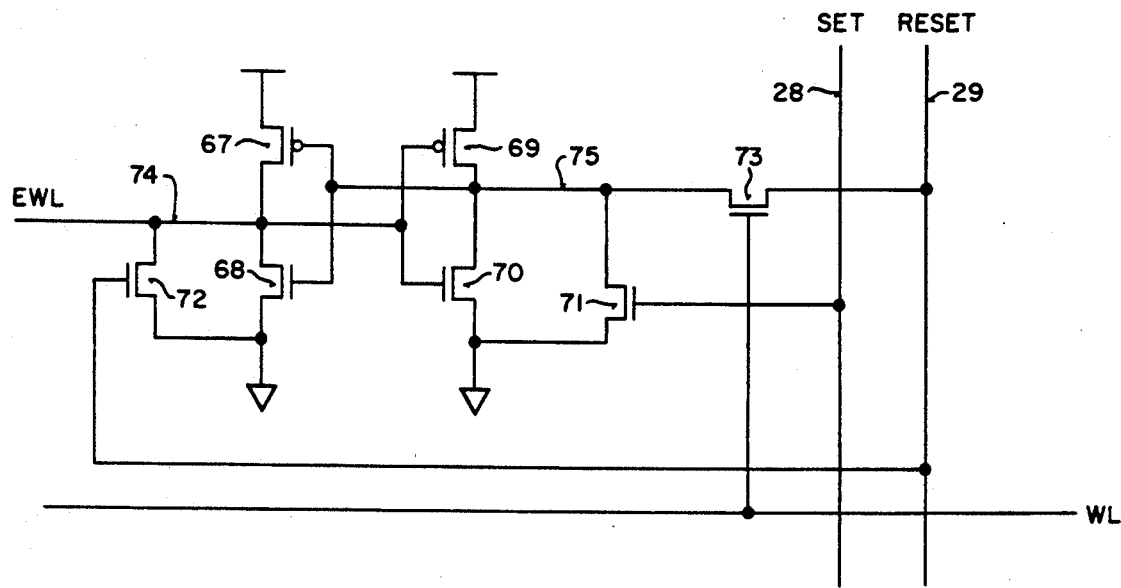
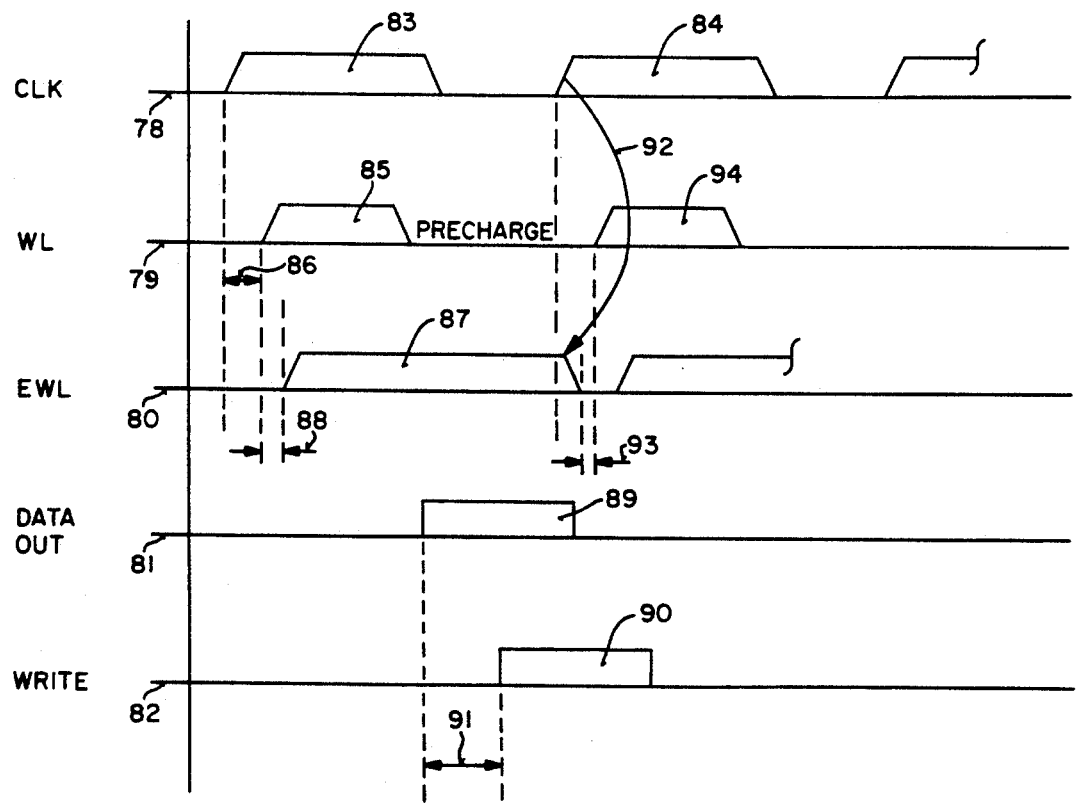

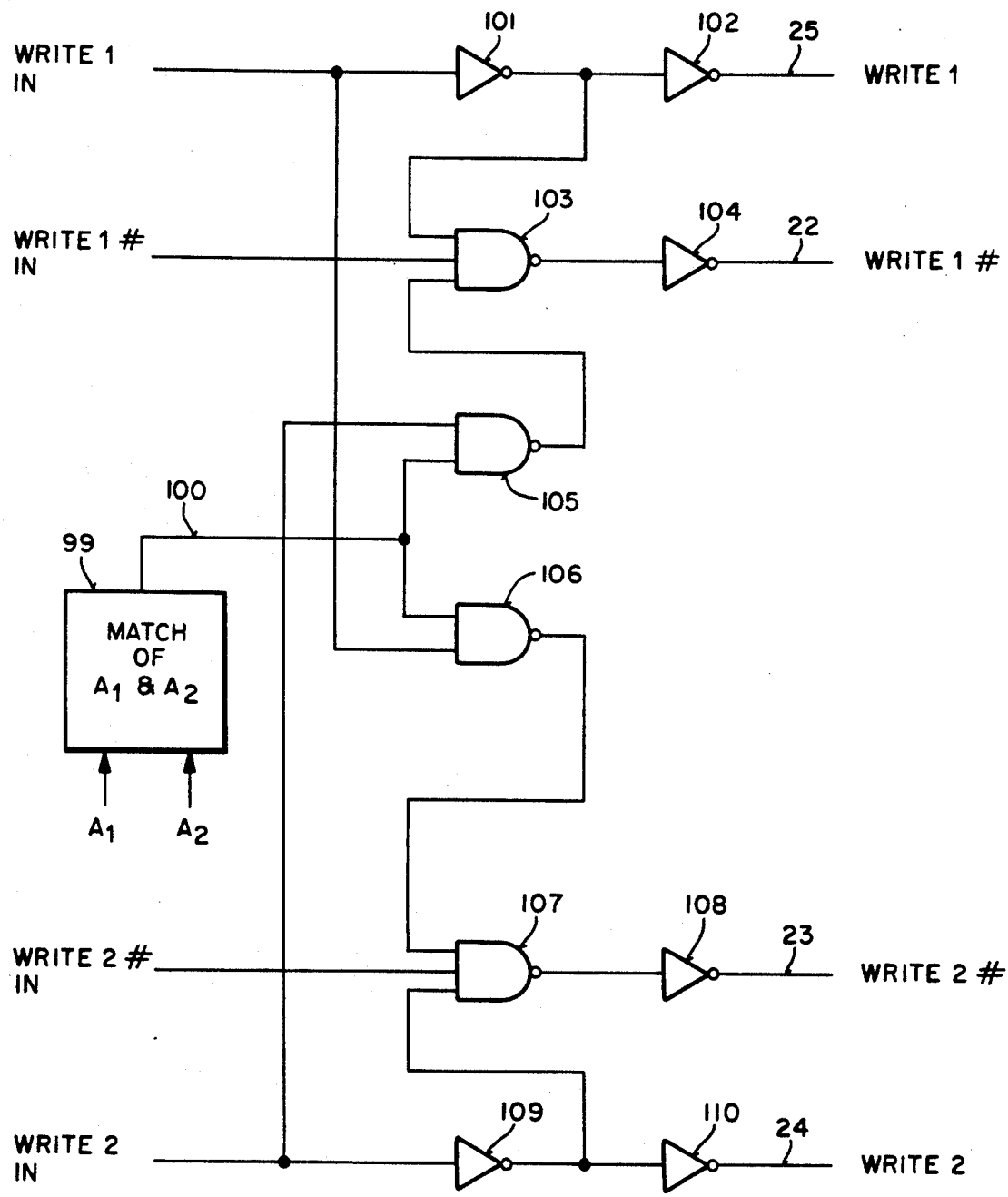
FIG_5

DUAL PORT STATIC MEMORY WITH ONE CYCLE READ-MODIFY-WRITE

This is a continuation of application Ser. No. 07/752,197, filed Aug. 20, 1991 abandoned, which is a continuation of application Ser. No. 07/458,985, filed Dec. 29, 1989, abandoned.

BACKGROUND OF THE INVENTION

1. Field of the Invention

The invention relates to the field of semiconductor memories.

2. Prior Art

Static memories are widely used in the semiconductor industry. For example, these memories are often used for cache memories. Typically, these memories are fabricated from a plurality of bistable circuits (flip-flops) each forming a cell for storing one bit of data. In the memory array bit lines are precharged for reading data from the cells; these bit lines are also used during writing by driving the lines to the desired state as determined by the incoming data.

Dual port static memory cells are also known in the prior art. An example of one such cell is shown in U.S. Pat. No. 4,823,314.

As can be seen, the present invention provides a dual port static memory where a read-modify-write operation can occur in one memory cycle. The memory also includes a circuit for resolving conflicting write data when one cell is accessed at both its ports.

SUMMARY OF THE INVENTION

An improvement is described for a bistable memory cell which allows new data to be written into the bistable memory cell while a bitline coupled to the cell is being precharged. The improvement includes a write line for receiving new data to be written into the bistable memory cell, switching means for coupling the new data into the memory cell, and an extended word line generator. The extended word line generator generates an extended word line signal that controls the switching means. The extended word line signal has an active state that enables the switching means to couple the new data into the bistable memory cell while precharge is placed on the bit line without disturbing the precharge. The extended word line signal goes active in response to an active state of a word line signal and remains active even after the word line signal returns to an inactive state. Prior to the beginning of the new memory cycle, the extended word line signal returns to an inactive state, thereby decoupling the new data from the switching means. During a read-modify-write operation, the bit lines may be precharged after data is read from the cell since the bit lines are isolated from the cell. This allows data to be written into the cells from the write lines without disturbing the precharge on the bit lines. The bit lines are then ready for a read operation during the very next memory cycle.

A circuit is also disclosed which resolves any conflict in data presented to a dual port cell.

BRIEF DESCRIPTION OF THE DRAWINGS

FIG. 3 is an electrical schematic of an extended word line control signal generator.

FIG. 4 is a timing diagram showing several waveforms associated with the operation of the invented memory.

FIG. 5 is an electrical schematic showing the circuit used to resolve conflicts in data when one dual port cell is selected by both addresses.

DETAILED DESCRIPTION OF THE INVENTION

Figure 1:
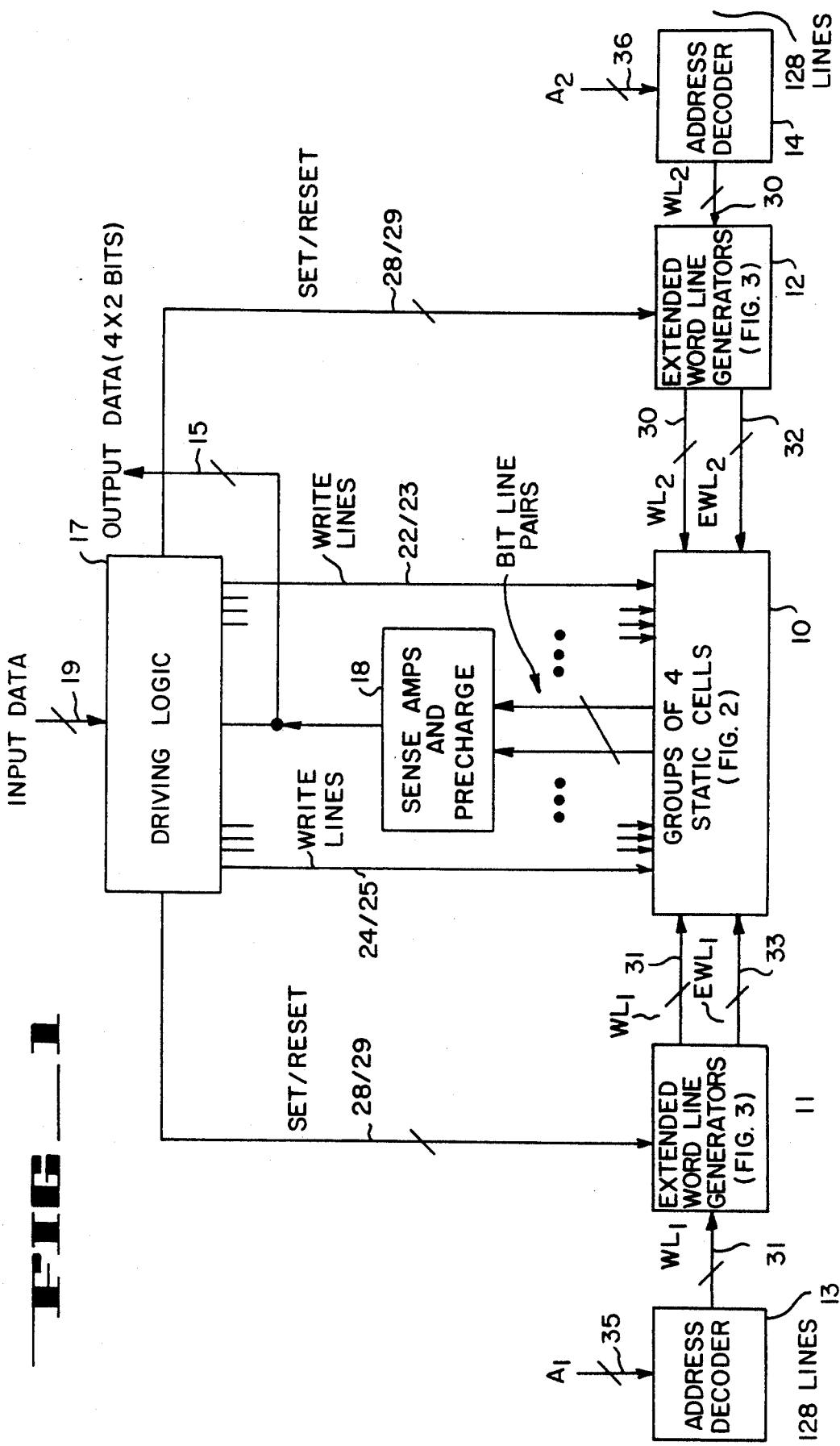
FIG. 1 is a block diagram showing the general layout of a memory employing the present invention.

A dual port memory employing static memory cells is described. In the following description, numerous specific details are set forth in order to provide a thorough understanding of the present invention. It will be obvious, however, to one skilled in the art that the present invention may be practiced without these specific details. In other instances, well-known circuits such as decoders are shown in block diagram form and other well-known details are not set forth in order not to unnecessarily obscure the present invention.

OVERVIEW OF THE MEMORY

In the currently preferred embodiment, the memory is part of a cache memory. The memory is fabricated using well-known complementary metal-oxide-semiconductor (CMOS) processing. In the drawings, the p-channel field-effect transistors are designated by the use of a small circle above the transistor's gate; the n-channel field-effect transistors are identified by the absence of the circle above the gate. The memory employs ordinary bistable (flip-flop) cells.

Figure 2:
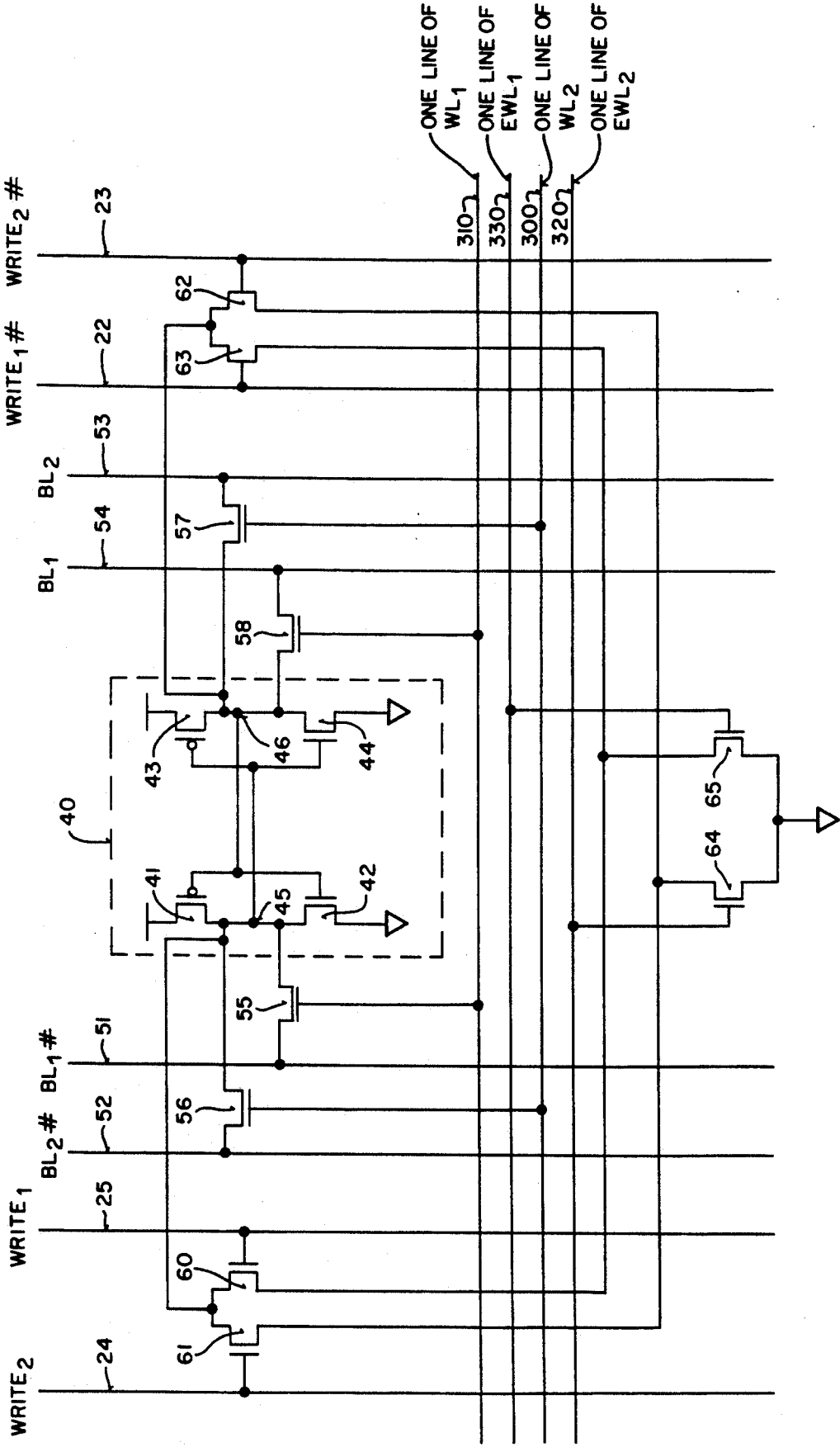
FIG. 2 is an electrical schematic showing the currently preferred embodiment of a single dual port static memory cell with its coupling to dual pairs of bit lines, dual pairs of write lines, two word lines, and two extended word lines.

In the currently designed dual port array there are 128 groups of four cells; one group is shown as the group of cells 10 of FIG. 1. Each group of 4 cells 10 is coupled to two word lines, two extended word lines, 4 pairs of (complementary) first write lines, 4 pairs of (complementary) second write lines, 4 pairs of first (complementary) bit lines and 4 pairs of second (complementary) bit lines. One cell from a group of four cells is shown in FIG. 2. This cell is coupled to two word lines, two extended word lines, a first and second pair of write lines and a first and second pair of bit lines.

In FIG. 1, the word lines are shown collectively as WL1 (lines 31) and WL2 (lines 30). In FIG. 2, a single one of the word lines WL1 is shown as word line 310 and a single one of the word lines WL2 as line 300. In FIG. 1, the extended word lines are shown collectively as EWL1 (lines 33) and EWL2 (lines 32). In FIG. 2, a single extended word lines is shown as line 320 and another as line 330. Two pairs of write lines, lines 22, 23, 24 and 25 are shown in FIGS. 1 and 2. The write signal, as discussed, is derived with the driving logic 17 from the input data supplied to the driving logic 17 on lines 19. Bit lines 51, 52, 53 and 54 are also shown in FIG. 2.

The memory is coupled to receive two addresses shown as A1 (lines 35) and A2 (lines 36). Each address is decoded (decoder 13 for A1 and decoder 14 for A2). In an ordinary manner these decoders select word lines. Decoder 13 selects one of the 128-WL1 lines and decoder 14 selects one of 128-WL2 lines.

Extended word line signals are generated by the extended word line control signal generators 11 and 12; one such generator is shown in FIG. 3. The generators 11 provide the EWL1 signals on lines 33 and the generators 12 provides the EWL2 signals on lines 32. There is an extended word line generator associated with each of the extended word lines and as will be seen in conjunction with FIG. 3, each of these generators is coupled to an associated word line and in effect, "extends" the word line signal if such signal is present.

Data is read from the cells on the bit lines through the sense amplifiers and precharge circuit 18. Prior to the sensing of the data on the bit lines, these bit lines are precharged as is well-known in the art. The output data is provided on lines 15. This output data is also coupled to the driving logic 17 for timing purposes. The logic 17, once data is outputted during a read-modify-write operation, then couples the input data to the write lines through the circuit shown in FIG. 5.

Reset/set signals on lines 28 and 29 are provided to the generators 11 and 12. These signals are shown and discussed in conjunction with FIGS. 3 and 4.

MEMORY CELL AND ITS COUPLING TO BIT LINES, WRITE LINES, WORD LINES AND EXTENDED WORD LINES

In FIG. 2, a single memory cell is shown with dotted line 40. (In the prior art static memory cells are often referred to as 6 transistors cells and include a bistable circuit such as shown within dotted line 40 and a pair of transfer transistors which connect the cell to complementary bit lines. These bit lines are used for both reading and writing. For purposes of this application, the memory cell has been defined not to include these transistors since the complementary nodes of the flip-flop are coupled to separate bit lines and write lines.) The cell comprises transistors 41 and 42 cross-coupled with the transistors 43 and 44. The node 45, the junction between transistors 41 and 42, is coupled to the gates of transistors 43 and 44. Similarly, the common junction (node 46) between transistors 43 and 44 is coupled to the gates of transistors 41 and 42. Node 45 is coupled to the bit line 51 (BL1#) through transistors 55 and to bit line 52(BL2#) through transistor 56. (The "#" symbol is used to designate the complementary binary state or line carrying that state.) The complementary node 46 is coupled to the bit line 53 (BL2) through transistor 57 and bit line 54(BL1) through transistor 58. The gates of transistors 58 and 55 are coupled to line 310, thus the state of the cell can be sensed on BL1 and BL1# when line 310 is positive or high. The gates of transistors 56 and 57 are coupled to line 300 and when this word line is high, data may be sensed on BL2 and BL2#.

Nodes 45 and 46 are also coupled to the write lines 22, 23, 24 and 25. One terminal of transistors 60 and 61 is coupled to node 45. The gate of transistor 61 is coupled to line 24. Node 46 is coupled to one terminal of transistors 62 and 63. The gate of transistor 62 is coupled to line 23 and the gate of transistor 63 is coupled to line 22. The other terminals of transistors 60 and 63 are coupled to ground through transistor 65. The gate of transistors 65 receives the signal on line 330 (one of the EWL1 signals). Similarly, the other terminals of transistors 61 and 62 are coupled to ground through transistor 64; this transistor's gate is coupled to line 320 (and hence, receives one of the EWL2 signals).

It should be noted that transistors 63 and 65 are coupled in series as are transistors 60 and 65. In a like fashion, transistors 62 and 64 and transistors 61 and 64 are coupled in series. Thus, for example, for write data transferred from line 22 to the node 46 of the cell, both transistors 63 and 65 must conduct (both Write 1# signal and the associated EWL1 signal are high). This is important, since as will be seen, the high EWL signal is terminated at the beginning of a cycle to prevent a bit line from being coupled to ground after a word line's potential rises for the next memory cycle.

Data is read from the cell through one port on BL1 and BL1# (lines 54 and 51, respectively) when line 310 is selected. And, similarly, data is read from the cell onto the bit lines BL2 and BL2# when line 300 is selected. It is possible for the addresses A1 and A2 to be the same, and hence, the same cell or group of cells are selected. For reading, this presents no problem since the data in the cell is read onto both pairs of bit lines.

Data is written into a cell from the write lines. For example, if Write 1 is high and Write 1# is low, and assuming the EWL1 signal on line 330 is high, then node 45 is coupled to ground through transistors 60 and 65 setting the state of the cell. Similarly, data can be written into the cell from lines Write 2 and Write 2#.

In prior art schemes, data is commonly written into the cells through the bit lines and transfer transistors. By writing data into the cells through the write lines the data, in effect, is written into the cells through the "backdoor". Note this technique may be used on a single port memory cell where only one pair of bit lines and one pair of write lines are used. Also in some memory it may be feasible to use a single (non-complementary) bit line and write line.

As previously indicated, lines 300, 310, 320 and 330 are coupled to other cells located along the same row as cell 40 and similarly, the bit lines and write lines are coupled to other cells located along the column which includes cell 40.

EXTENDED WORD LINE GENERATOR

Each of the extended word lines includes an extended word line generator which is coupled to its associated word line. One such generator is shown in FIG. 3. The generator basically comprises a bistable circuit (transistors 67, 68, 69 and 70). One node 74 provides an output (the extended word line signal), the other node 75 of this circuit is coupled through transistor 73 to the reset line 29. The gate of transistor 73 is coupled to (or is part of) the associated word line. The reset line 29 is also coupled to the gate of transistor 72; this transistor pulls to ground node 74 when the reset signal is high. The set line 28 is coupled to the gate of transistor 71. When the set signal is high, node 75 is coupled to ground.

At the beginning of every memory cycle, all the word line generators are reset. This occurs when the potential on line 29 rises and the potential on line 28 remains low. Note that at this time no potential is present on any of the word lines. The potential on line 29 causes transistor 72 to conduct, setting the bistable circuit so that node 74 is low, that is, no extended word line signal is raised to a high level. During the memory operation, such as a read-modify-write operation, the reset signal on line 29 remains low after the memory cycle is initiated and the potential on the selected word lines rises. If the word line is asserted, then transistor 73 conducts, pulling node 75 to ground through the reset line. In this case, the extended word line signal is high as it would be in a read-modified-write operation. If the word line is not selected, then node 74 remains at ground for the remainder of the cycle. (The set signal on line 28 may be used to raise to the high level the extended word line signal. This, for example, may be done to initialize all the memory cells in the memory.)

MEMORY OPERATION AND TIMING

During an ordinary read cycle, addresses are applied to the address decoders selecting one or two word lines. The selected cell, or cells, are then coupled to the bit lines providing an output. The bit lines are first precharged as is commonly done to allow the sense amplifiers to more quickly sense the cell's state. Note that with the illustrated memory organization, one cell will be coupled to one set of bit lines and another cell to another set of bit lines if the addresses are different, or one cell will be connected to both sets of bit lines if the addresses are the same. In this latter event, the same data is read onto both sets of bit lines.

Line 78 of FIG. 4 shows the waveforms 83 and 84 of the clocking signal each of which initiates a memory cycle. Line 79 shows the word line signal which follows the decoding of the addresses after the clock signal has occurred. For example, the leading edge of waveform 85 follows (in time) the leading edge of waveform 83 by time 86. The extended word line signals are shown on line 80. Since the EWL signal requires the word line signal for its generation, the EWL signal follows the WL signal. The leading edge of waveform 87 is shown trailing the leading edge of waveform 85 by time 88.

During a write operation, the input data from lines 19 is coupled onto the write lines 22, 23, 24 and 25. The extended word line generators associated with the selected word lines provide the high level EWL signal which is shown on line 80 of FIG. 4. This signal continues on in time beyond when the word line signal for that cycle drops in potential. This allows the data on the write lines to be coupled into the cell or cells setting the cells in the appropriate state. The timing of the EWL signal is discussed below for the read-modified-write operation.

Importantly, the present invention permits a read-modify-write operation for the selected cell or cells in one memory cycle as described below.

Both in a read operation and initial portion of the read-modify-write operation, once the word line rises in potential, the state of the cells can be sensed on the bit lines, these bit lines having previously been precharged. Once the EWL signal is at a high level, transistors 64 or 65 or in some cases both transistors conduct. However, this does not cause any writing into the cell at this time for the read-modify-write operation. The driving circuits which provide the write line signals do not provide data until the sense amplifiers have latched the output data. For this reason, the output of the sense amplifiers is also coupled to the driving circuit 17. Once the driving circuit senses that data is present on the output data lines 15, the write lines are activated. At this time, since for example, both transistors 60 and 65 conduct, data is written into the cell. The data out is represented in FIG. 4 on line 81 by the waveform 89 and a write signal is shown on line 82 by waveform 90. The leading edge of the write signal follows the leading edge of the data out signal by time 91.

Once the data has been sensed, the word line potential drops, isolating the bits lines from the cell, or cells. This permits the prechanging of the bit lines in preparation for the next memory cycle. Importantly, once the next clocking signal occurs, the EWL generator is reset causing the EWL signal to drop. This is shown by line 92. It is important to note that the EWL signal drops in potential before the next word line signal occurs. Note the time 93 which occurs between the trailing edge of waveform 87 and the leading edge of waveform 94. This prevents charge on the bit lines from being disturbed by the writing operation. Therefore, it is possible to have a read-modify-write operation in one memory operation and indeed, read-modify-write operations can occur one after the other in the invented memory.

Alternately, the write lines can be clamped once the clock rises on the next cycle.

RESOLUTION OF CONFLICTING DATA

As mentioned, in the currently preferred embodiment, A1 and A2 may select the same cell and in a write operation conflicting data may be applied to the write lines. The circuit of FIG. 5 senses when this occurs and then places the cell in a predetermined state when data conflict occurs.

The circuit for resolving the conflict includes a comparator 99 which provides an output signal on line 100 when the addresses on lines A1 and A2 are the same. The signal on line 100 is applied to input terminals of the NAND gates 105 and 106. The other terminal of NAND gate 106 is coupled to receive the Write 1 IN signal. The other terminal of the NAND gate 105 is coupled to receive the Write 2# IN signal. The Write 1 IN signal is applied through the series inverters 101 and 102 to provide the Write 1 signal on line 25. The Write 1# IN signal is applied to one input terminal of NAND gate 103. The output of the inverter 101 is also an input to the NAND gate 103. The third input to this gate is the output of gate 105. The output of gate 103 is coupled through the inverter 104 to provide the Write 1# signal on line 22. The Write 2# IN signal is applied to one input terminal of the NAND gate 107. The output of the gate 106 provides another input to gate 107. The Write 2 IN signal is the third input to gate 107 after this signal is coupled through the inverter 109. The output of the gate 107, after passing through inverter 108, provides the Write 2# signal on line 23. The Write 2 IN signal is coupled through inverters 109 and 110 to provide the Write 2 signal on line 24.

Assume first that the addresses A1 and A2 are different. The potential on line 100 is low and therefore, since gates 105 and 106 are NAND gates, their outputs will be high. Consequently, high inputs are provided to gates 103 and 107. This effectively removes gates 105 and 106 and their outputs from the remainder of the circuit. For example, no matter what the input on the Write 1 IN line, the output of gate 106 remains high.

Considering the circuit of FIG. 5 without gates 105 and 106, it can be readily seen that the Write 1 signal appears on line 25 unaltered in state since it passes through two inverters. Similarly, the Write 2 IN signal after passing through inverters 109 and 110 appears on line 24 unaltered in state. If the Write 1# IN signal is high, the input from inverter 101 will be low, since the Write 1 IN and Write 1# IN signals are complementary. All of the inputs to gate 103 are thus high, and therefore the output of this NAND gate will be low. After passing through inverter 104, the Write 1# signal is low. Similarly, the Write 2# IN signal appears on line 23 unaltered as long as the addresses do not match.

Next, consider the case when a match of address occurs and the Write 1 IN signals and the Write 2IN signals are high. (This is a case of non-conflicting data.) Both inputs to gates 105 and 106 are high and hence, both outputs of these gates will be low. Consequently, at least one input to gates 103 and 107 is low and thus the output of both these gates are high. The output from gate 103 after passing through inverter 104 provides a low Write 1# signal. The output of gate 107 will be high, and after passing through inverter 108, a low signal is present on line 23. Thus, for this case of non-conflicting data: Write 1 and Write 2 signals are high, and Write 1# and Write 2# signals are low.

The other case for non-conflicting data occurs when the Write 1 IN and Write 2 IN signals are low. When the Write 1 IN signal low, a high input is applied to gate 107 form gate 106. The Write 2# IN signal is high as is the output of the gate 109. Thus a low output will occur from gate 107. This output, after passing through inverter 108, provides a high output on line 23. Similarly, a high output occurs on line 22.

In the case of conflicting data, when a match occurs, the positive signal on either the Write 1 IN or Write 2 IN line prevails and sets the flip-flop in a predetermined state (node 45 of the cell low). For example, if the Write 1 IN signal is high, and the Write 2 IN signal low, the output of gate 106 is low. This causes the output of gate 107 to be high and the output of gate 108 to be low. In essence, the high signal on the Write 2# IN line is suppressed by gate 107 and hence, the conflicting data is suppressed. The same is true if the Write 2 IN signal is high and the Write 1 IN line is low. Then, the output of gate 105 is low and gate 103 suppresses the high Write 1# IN signal.

Therefore the conflicting data is resolved so as to set the cell in a predetermined state.

Thus, a memory has been described which permits a read-modify-write cycle operation in a single memory cycle.

I claim:

1. In a memory having at least one bistable memory cell coupled to a bit line in said memory through a first transistor having a gate, said gate of said first transistor being coupled to a word line signal said word line signal having an active state enabling reading of data stored in said bistable memory cell and an inactive state isolating said bistable memory cell from said bit line, an improvement allowing writing of new data into said bistable memory cell to occur while precharging said bit line, said precharging and writing occurring during a single memory cycle, said improvement comprising:

a write line for receiving new data to be written into said bistable memory cell, switching means for coupling said new data into said bistable memory cell; and an extended word line generator for generating an extended word line signal for controlling the switching means, the extended word line signal having an active state for enabling the switching means to couple said new data into said bistable memory cell while a precharge is placed on said bit line without disturbing said precharge, the extended word line signal going active in response to the active state of the word line signal and remaining active after the word line signal returns to the inactive state, the extended word line signal having an inactive state for decoupling the new data from the switching means prior to a beginning of a new memory cycle.

2. The improvement defined by claim 1 wherein said external word line generator is reset, such that said extended word line signal goes to an inactive level at the beginning of each memory cycle.

3. The improvement defined by claim 2 wherein said switching means comprises a second and third transistors, coupled in series between said cell and a reference potential, the gate of said second transistor being coupled to said write line and the gate of said third transistor being coupled to receive said first signal.

4. The improvement defined by claim 1 wherein said first data is received on said write line after said data in said bistable memory cell has been sensed.

5. In a memory having a bistable memory cell having a first port and a second port, the first port having a first bit line coupled to the bistable memory cell and a first word line coupled to the bistable memory cell, the first word line having an active state for selecting the bistable memory cell, the second port having a second bit line coupled to the bistable memory cell and a second word line coupled to the bistable memory cell, the second word line having an active state for selecting the bistable memory cell, the improvement comprising:

a) a first write line associated with the first port for receiving a first data to be written into the bistable memory cell;

b) a first switching means for coupling the first data into the bistable memory cell in response to an active state of a first extended word line signal;

c) a first extended word line generator for generating the first extended word line signal, the first extended word line generator bringing to the active state the first extended word line signal in response to the active state of the first word line;

d) a second write line associated with the second port for receiving a second data to be written into the bistable memory cell;

e) a second switching means for coupling the second data into the bistable memory cell in response to an active state of a second extended word line signal;

f) a second extended word line generator for generating the second extended word line signal, the second extended word line generator bringing to the active state the second extended word line signal in response to the active state of the first word line; and g) contention resolution means coupled to the bistable memory cell for suppressing the second data when the first word line is active while the second word line is active and the first data does not equal the second data.

6. The improvement defined by claim 5 wherein a precharge on the first bit line is undisturbed while the first data is coupled into the bistable memory cell.

7. The improvement defined by claim 5 wherein a precharge on the second bit line is undisturbed while the second data is coupled into the bistable memory cell.

* * * * *

UNITED STATES PATENT AND TRADEMARK OFFICE
CERTIFICATE OF CORRECTION

PATENT NO. : 5,235,543

DATED : 08/10/93

INVENTOR(S) : Eitan E. Rosen

It is certified that error appears in the above-indentified patent and that said Letters Patent is hereby corrected as shown below:

```
Column 3, line 22 delete "with" insert --within--.
Column 5, line 62 delete "prechanging" insert --precharging--.
```

Signed and Sealed this

Second Day of August, 1994

Attest:

BRUCE LEHMAN

Attesting Officer     Commissioner of Patents and Trademarks